(12) United States Patent
Lee et al.

(10) Patent No.: US 7,520,173 B2
(45) Date of Patent: Apr. 21, 2009

(54) INTERDIGITATED ELECTRODE FOR ELECTRONIC DEVICE AND ELECTRONIC DEVICE USING THE SAME

(75) Inventors: Sung Q Lee, Daejeon (KR); Hye Jin Kim, Daejeon (KR); Kang Ho Park, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/865,427

(22) Filed: Oct. 1, 2007

(65) Prior Publication Data

US 2008/0134792 A1    Jun. 12, 2008

(30) Foreign Application Priority Data

Dec. 6, 2006   (KR) .................. 10-2006-0122720
Jun. 5, 2007   (KR) .................. 10-2007-0054905

(51) Int. Cl.
*G01L 9/00*   (2006.01)
(52) U.S. Cl. ....................................................... 73/754
(58) Field of Classification Search ............. 73/700, 73/754, 756
See application file for complete search history.

(56) References Cited

U.S. PATENT DOCUMENTS

| 2005/0194650 | A1 | 9/2005 | Hung |
| 2006/0000286 | A1 | 1/2006 | Makela et al. |
| 2007/0084293 | A1* | 4/2007 | Kaiserman et al. ............ 73/763 |

FOREIGN PATENT DOCUMENTS

| JP | 64-061112 | 3/1989 |
| JP | 01-094232 | 4/1989 |
| JP | 09-101283 | 4/1997 |
| JP | 11-186867 | 7/1999 |
| JP | 2003-259662 | 9/2003 |
| KR | 10-0234698 | 12/1999 |
| KR | 20030075906 | 9/2003 |

OTHER PUBLICATIONS

Jian Cai, et al., "A Study on Packaging of PZT MEMS Microphone", 2005 Electronic Components and Technology Conference, IEEE, 2005 pp. 1077-1080.
Sherif A. Saleh, et al., "Design of Piezoelectric Cantileber Microphone and its MEMS-Acoustical Circuit for Hearing Aid Devices", IEEE, 2004, pp. 897-900.
Sung Lee, et al., "MEMS Acoustic Sensor Using PMN-PT Single-Crystal Diaphragm", SPIE OpticsEast, Oct. 1-4, 2006.

* cited by examiner

*Primary Examiner*—Andre J Allen
(74) *Attorney, Agent, or Firm*—Rabin & Berdo, PC

(57) ABSTRACT

Provided are an interdigitated electrode (IDE) for an electronic device, which includes a plurality of anodes and a plurality of cathodes arranged radially in an alternating fashion for electrical insulation from one another, and an electronic device using the same. The IDE in which the anodes and the cathodes are arranged radially in an alternating fashion is fabricated and applied to the electronic device, so that the entire fabrication process can be simplified compared to that of a typical electronic device in which an upper electrode is different from a lower electrode. Also, circular or polygonal IDEs can be applied to systems that are driven or measure values on their central axes, thereby enhancing the performance and efficiency of the systems. Furthermore, the circular or polygonal IDEs can be employed in systems such as acoustic sensors, pressure sensors, micro-speakers, biological sensors, and acceleration sensors, so that the structure and operation of the systems can be simplified.

4 Claims, 7 Drawing Sheets

Uniform load

INTERDIGITATED ELECTRODE FOR ELECTRONIC DEVICE AND ELECTRONIC DEVICE USING THE SAME

CROSS-REFERENCE TO RELATED APPLICATION

This application claims priority to and the benefit of Korean Patent Application No. 2006-0122720, filed Dec. 6, 2006, and No. 2007-0054905, filed Jun. 5, 2007, the disclosure of which is incorporated herein by reference in its entirety.

BACKGROUND

1. Field of the Invention

The present invention relates to an interdigitated electrode for an electronic device and an electronic device using the same, and more specifically, to an interdigitated electrode for an electronic device which has a symmetric structure, such as a circular structure or a polygonal structure, and an electronic device using the same.

The present invention has been produced from the work supported by the IT R&D program of MIC (Ministry of Information and Communication)/IITA (Institute for Information Technology Advancement) [2006-S006-01, Components/Module technology for Ubiquitous Terminals] in Korea.

2. Discussion of Related Art

In general, an electronic device includes a sensor, an actuator, and a micro-electro-mechanical system (MEMS) device. The sensor functions to detect and measure various physical quantities. Some types of sensors are a piezoelectric sensor formed of a piezoelectric material, an acoustic sensor, a piezoelectric acoustic sensor, and a pressure sensor. The actuator performs mechanical functions using energy and may be, for example, a piezoelectric actuator. The MEMS device is used for microelectronic systems and may include a MEMS acoustic sensor, a MEMS actuator, or a MEMS speaker. The electronic device may include an electrode used for converting capacitance or energy.

Hereinafter, an electrode for a conventional electronic device will be described with reference to FIG. 1.

FIG. 1 is a cross-sectional view of a conventional electronic device. Conventionally, an electronic device 1 includes upper and lower electrodes 14 and 12 located on and under a piezoelectric layer (PZT) 13, respectively. An oxide layer 11, the lower electrode 12, the PZT 13, the upper electrode 14, and an oxide layer 15 are disposed on a substrate 10. A metal 16 is connected to an end portion of each of the lower and upper electrodes 12 and 14. In the electronic device, the substrate 11 is formed of bulk silicon (Si), and the oxide layers 11 and 15 are formed of silicon oxide ($SiO_2$), silicon nitride, or zinc oxide. The lower and upper electrodes 12 and 14 are formed of titanium/platinum (Ti/Pt), aluminum (Al), Pt, tungsten (W), or tantalum (Ta). In the electronic device 1 shown in FIG. 1, the metal 16 is formed of Al.

However, in the case of the foregoing electronic device 1, since the upper and lower electrodes 14 and 12 should be provided on and under the PZT 13, the fabrication process becomes complicated. In particular, the flow of electricity makes an angle of 90° with an electrode direction in a sensor or actuator using the PZT 13, so that the sensor or actuator has a far smaller piezoelectric coefficient. Thus, the structure of the electronic device 1 may deteriorate the sensitivity of the sensor or the efficiency of the actuator.

In order to solve this problem, a technique using an interdigitated electrode (IDE) has been proposed. FIG. 2 is a plan view of an IDE used for a conventional electronic device. For simplicity, other components of a MEMS device besides the IDE will not be described.

Referring to FIG. 2, an IDE 20 is a linear IDE in which an anode 21 and a cathode 22 are repetitively interdigitated. As is known, the linear IDE 20 may be used for some MEMS devices, such as a cantilever sensor or a cantilever actuator. Thus, the linear IDE 20 may drive a cantilever or generate a voltage in a pressure-deformed cantilever and apply the voltage to the cantilever sensor. The foregoing linear IDE 20 may be employed in various electronic devices. For example, the linear IDE 20 may be used for a comb driver or a planar acoustic sensor. Alternatively, the linear IDE 20 may be used for a sensor or an actuator of a linear piezoelectric structure so that the surface of an electrode is elevated to increase sensitivity or drivability. In another case, the linear IDE 20 may be used for a biological sensor or a gas sensor to increase an electrode contact area. Since both the anode 21 and the cathode 22 are located on one surface of the linear IDE 20, it is easy to manufacture the linear IDE 20.

The linear IDE 20 is adequate for linear and comb-type devices, such as a square device or a cantilever device. However, it is difficult to install the linear IDE 20 on a symmetrical structure, for example, symmetric oscillation and actuation plates. When installed on such symmetrical structures, the efficiency of the linear IDE 20 decreases.

SUMMARY OF THE INVENTION

The present invention is directed to an interdigitated electrode (IDE) for an electronic device which has a radial structure with anodes and cathodes arranged in an alternating fashion, and an electronic device using the IDE.

The present invention is also directed to a circular or polygonal IDE including anodes and cathodes, and an electronic device using the same.

According to an aspect of the present invention, there is provided an IDE for an electronic device which includes a plurality of anodes and a plurality of cathodes arranged radially in an alternating fashion for electrical insulation from one another.

The anodes and the cathodes may be symmetrically interdigitated in a circular or polygonal shape. The IDE further includes ground electrodes electrically insulated from the anodes and the cathodes, and disposed in alternating fashion with one of the anodes and the cathodes.

According to another aspect of the present invention, there is provided an electronic device comprising the above-described IDE and a piezoelectric material layer. The piezoelectric material layer may be formed of PMN-PT, PZT, or ZnO. The electronic device may include a sensor device selected from the group consisting of a pressure sensor, an acoustic sensor, and an ultrasonic sensor; a micro-electro-mechanical system (MEMS) device selected from the group consisting of a MEMS actuator and a MEMS sensor; a power source; and a driver.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown. For clarity and conciseness, other components of an electronic device besides an IDE will not be described.

Figure 1:
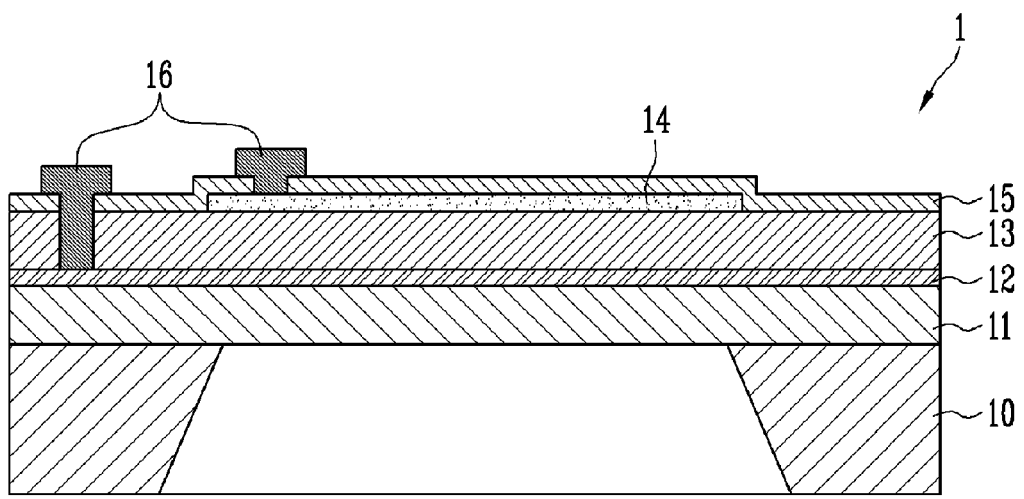
FIG. 1 is a cross-sectional view of a conventional electronic device.
Figure 2:
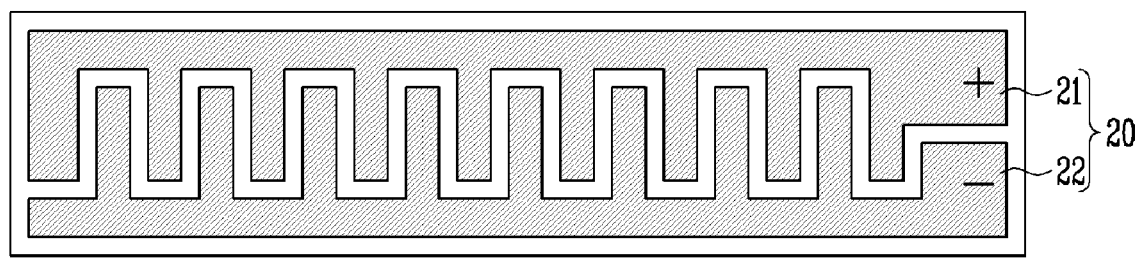
FIG. 2 is a plan view of an interdigitated electrode (IDE) used for a conventional electronic device.
Figure 3A:
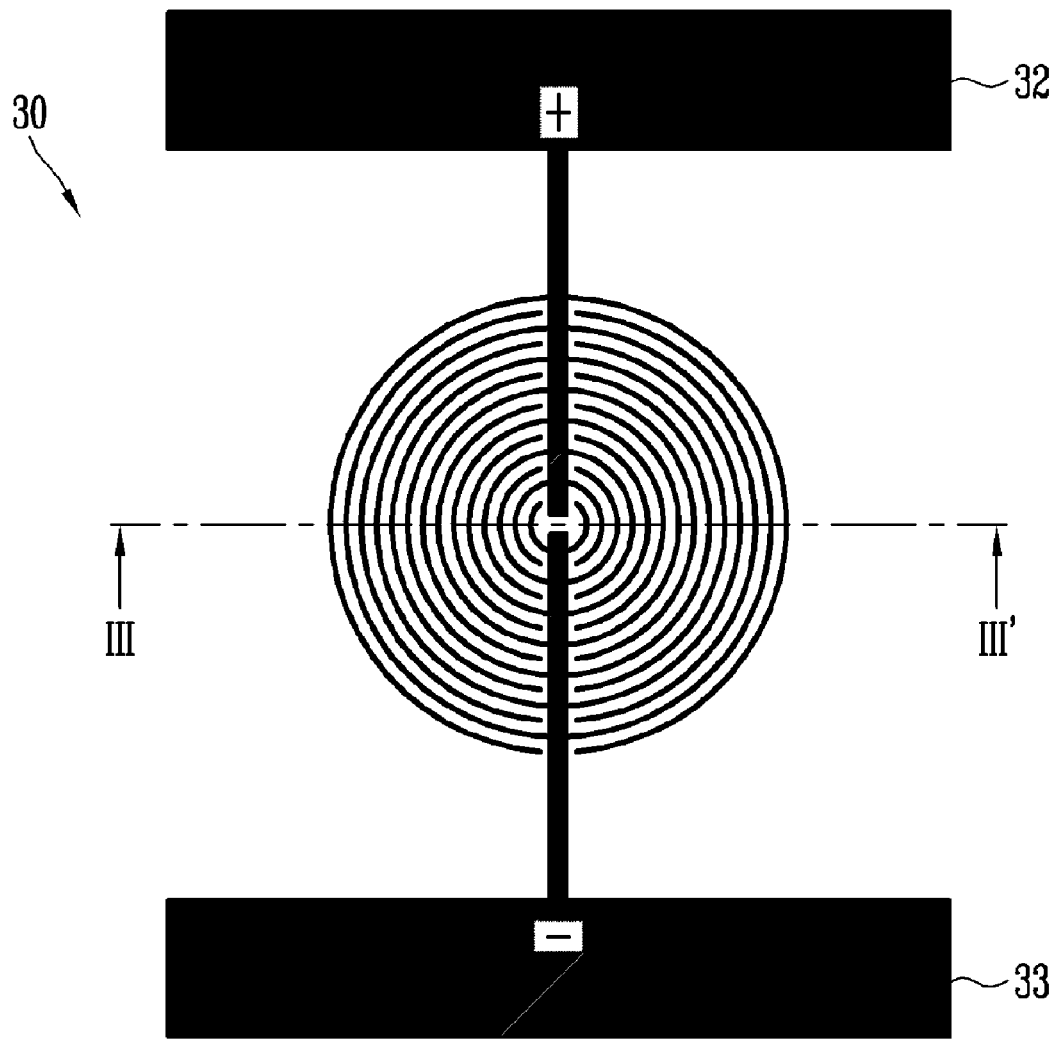
FIG. 3A is a plan view of a symmetric IDE according to an exemplary embodiment of the present invention.
Figure 3B:
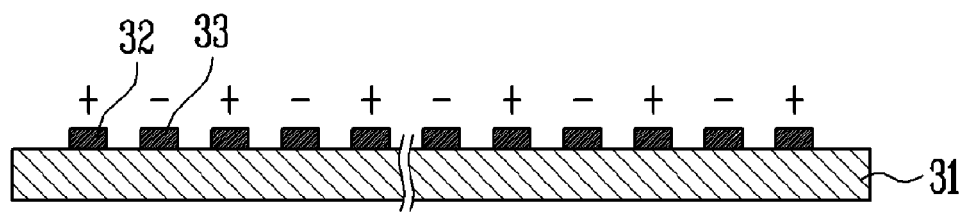
FIG. 3B is a cross-sectional view taken along line III-III' of FIG. 3B.

FIG. 3A is a plan view of a symmetric IDE according to an exemplary embodiment of the present invention, and FIG. 3B is a cross-sectional view taken along line III-III' of FIG. 3B.

Referring to FIGS. 3A and 3B, a circular IDE 30 is a circular IDE with a radially symmetric structure. The circular IDE 30 is disposed at least one surface of a substrate of an electronic device and made by arranging anodes 32 and cathodes 33 in alternating fashion. Although only the circular IDE 30 is illustrated and described in the current embodiment, various symmetric IDEs, for example, polygonal IDEs, such as square, hexagonal, and octagonal IDEs, may be formed with radial symmetry about a central axis.

By forming the IDE 30 in which the anodes 32 and the cathodes 33 are arranged in alternating fashion on at least one surface of the electronic device, the electronic device can perform its functions effectively. In general, an electronic device includes a sensor, an actuator, a micro-electro-mechanical system (MEMS) device, a driver, and a power source. The sensor may be a piezoelectric sensor formed of a piezoelectric material, for example, $PMN-PT(Pb(Mg_{1/3}Nb_{2/3})O_3$—$PbTiO_3)$, $PZT(Pb(Zr_xTi_{1-x})O_3)$, or ZnO, an acoustic sensor, a piezoelectric acoustic sensor, or a pressure sensor. The actuator performs mechanical functions using energy and may be, for example, a piezoelectric actuator. The MEMS device is used for microelectronic systems and may be a MEMS acoustic sensor, a MEMS actuator, or a MEMS speaker.

For instance, when the symmetric IDE 30 is mounted on an acoustic sensor, the sensitivity of the acoustic sensor is improved compared with when a linear IDE is used. Specifically, since a central portion of an oscillation plate of the acoustic sensor is deformed by sound pressure, it is more efficient to mount the centrally symmetric IDE 30 with a circular or polygonal structure on the acoustic sensor to convert the deformation into an electrical signal. Also, when the acoustic sensor is driven by respectively applying a positive voltage and a negative voltage to the anodes 32 and the cathodes 33 of the foregoing circular IDE 30, the circular IDE 30 itself can function as a speaker, so that a speaker having a higher sound pressure can be fabricated under constant voltage conditions.

Figure 4:
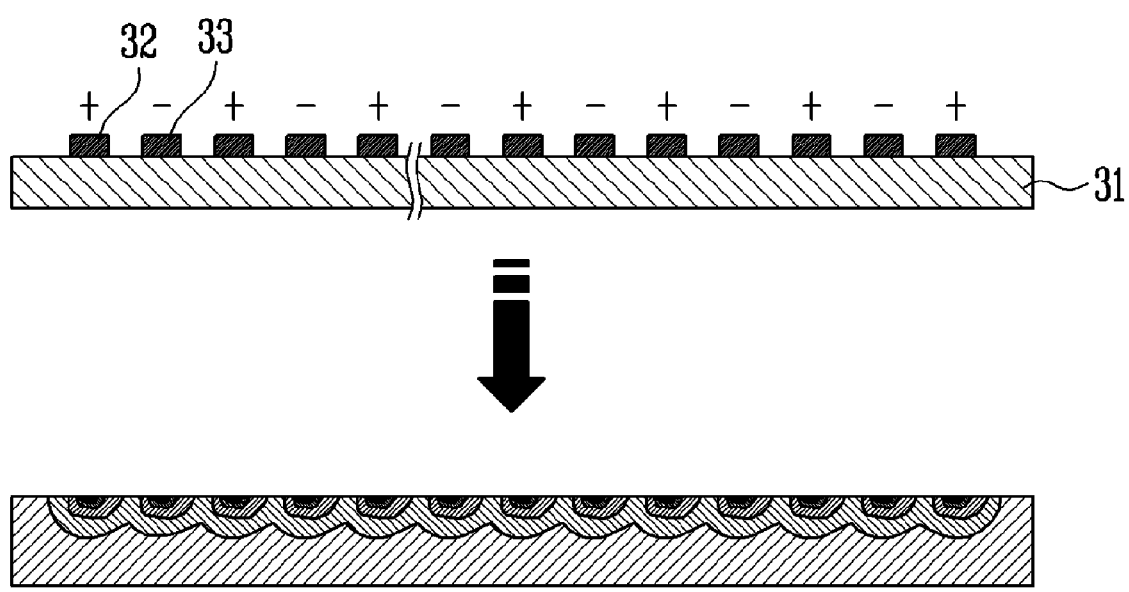
FIG. 4 is a diagram showing the distribution of an electric field in the symmetric IDE shown in FIG. 3B.

FIG. 4 is a diagram showing the distribution of an electric field in the circular IDE shown in FIG. 3B.

Referring to FIG. 4, when a positive voltage is applied to the anodes 32 and a negative voltage is applied to the cathodes 33, an electric field is distributed in lower regions of the anodes and cathodes 32 and 33. In particular, when the circular IDE 30 is mounted on a pressure sensor or an acoustic sensor, a pressure is applied due to the oscillation of a top surface so that a voltage is induced in the circular IDE 30 to enhance sensitivity.

Figure 5A:
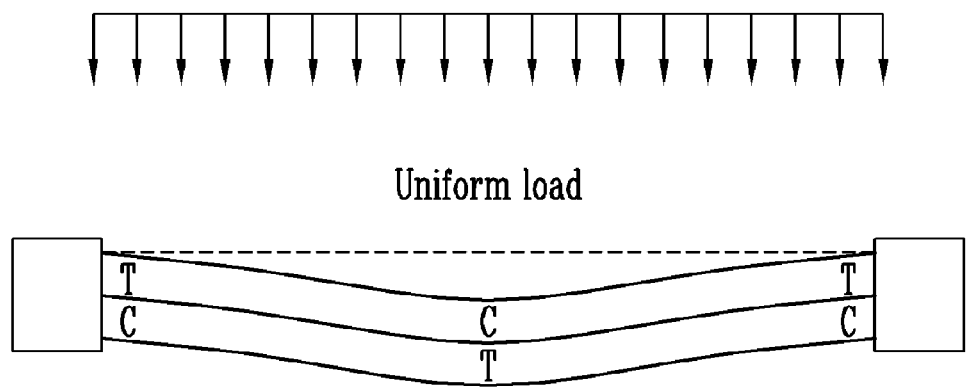
FIG. 5A is a cross-sectional view showing compressive and expansive loads applied to a substrate due to a circular IDE according to an exemplary embodiment of the present invention.
Figure 5B:
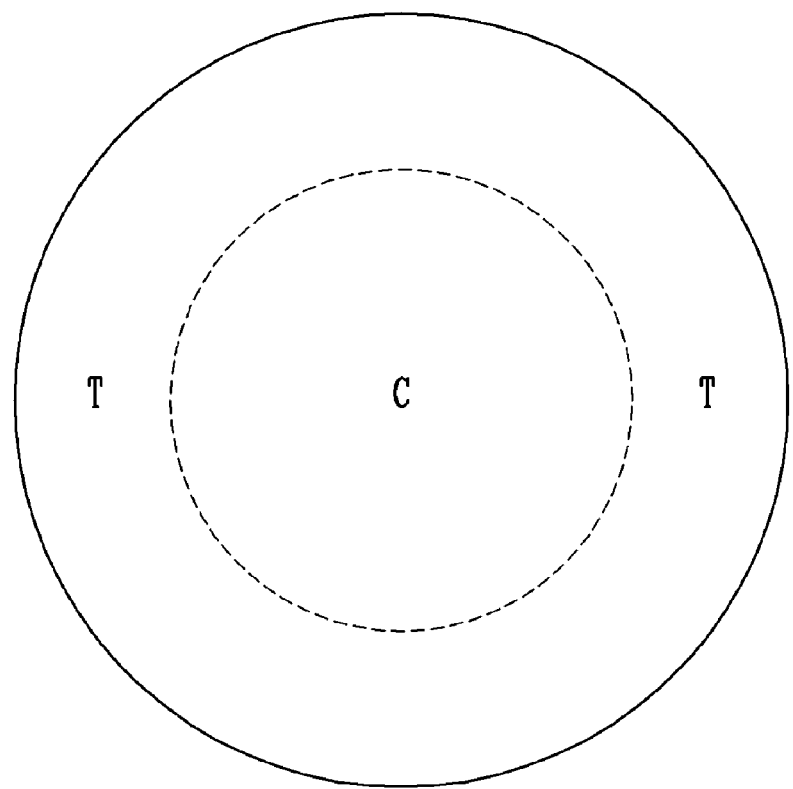
FIG. 5B is a plan view corresponding to the cross-sectional view of FIG. 5A.

FIG. 5A is a cross-sectional view showing compressive and expansive loads applied to a substrate due to a circular IDE according to an exemplary embodiment of the present invention, and FIG. 5B is a plan view corresponding to the cross-sectional view of FIG. 5A.

Referring to FIGS. 5A and 5B, when a uniform load is applied to a substrate (e.g., a circular plate) on which a circular IDE is mounted, compression C occurs in a central part of an upper region of the circular plate, while expansion T occurs in an edge part thereof, and expansion T occurs in a central part of a lower region of the circular plate, while compression C occurs in an edge part thereof. Thus, when the circular IDE is fabricated by arranging anodes and cathodes in alternating fashion as shown in FIG. 3, a compressive load (i.e., a positive voltage) is generated in an outer region of the circular plate, while an expansive load (i.e., a negative voltage) is generated in an inter region thereof, so that the positive and negative voltages may counterbalance each other. For this reason, a circular or polygonal IDE in which a positive voltage and a negative voltage do not counterbalance each other has been developed recently.

Figure 6A:
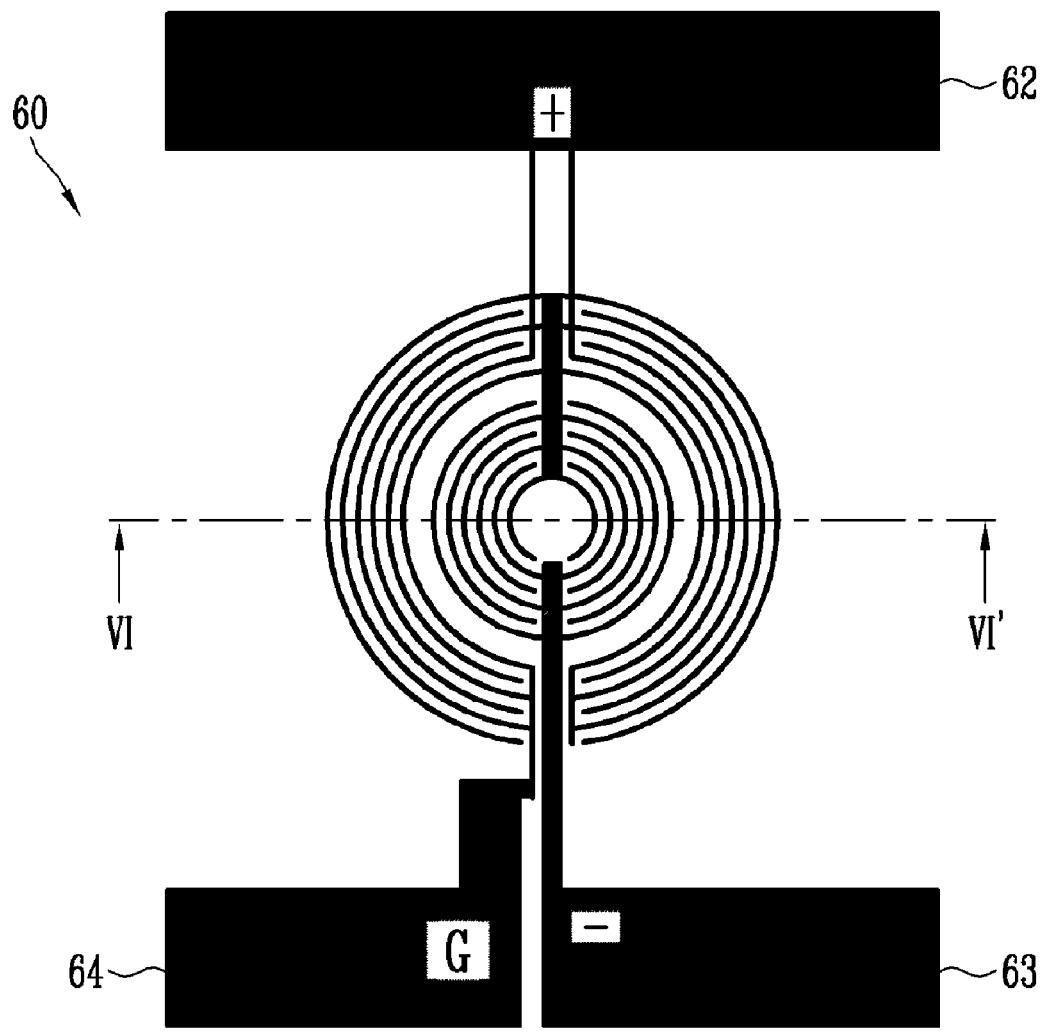
FIG. 6A is a plan view of a circular IDE according to another exemplary embodiment of the present invention.
Figure 6B:
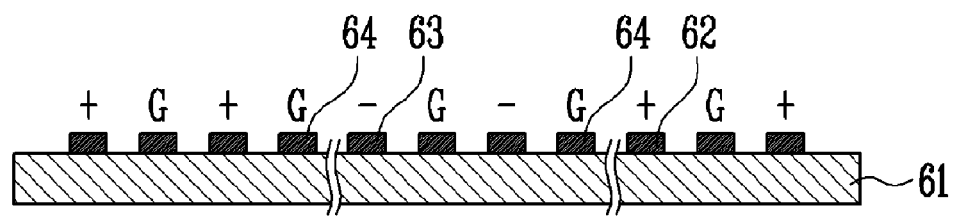
FIG. 6B is a cross-sectional view taken along line VI-VI' of FIG. 6A.

FIG. 6A is a plan view of a circular IDE according to another exemplary embodiment of the present invention, and FIG. 6B is a cross-sectional view taken along line VI-VI' of FIG. 6A.

Referring to FIGS. 6A and 6B, a circular IDE 60 has a centrally symmetrical structure fabricated by arranging an anode 62, a cathode 63, and a ground electrode 64 in alternating fashion. Specifically, in the current embodiment, the ground electrode 64 and the cathode 63 are arranged in alternating fashion in an inner region of the circular IDE 60, while the ground electrode 64 and the anode 62 are arranged in alternating fashion in an outer region thereof. As described above, when the circular IDE 60 includes the anodes 62, the cathodes 63, and the ground electrodes 64, a ground voltage and a negative voltage are induced in the inner region of the circular IDE 60, and the ground voltage and a positive voltage are induced in the outer region thereof based on a boundary between compression and expansion, so that the sensitivity of a sensor or the efficiency of an actuator can be further enhanced using the difference between the positive voltage and the negative voltage.

Figure 7A:
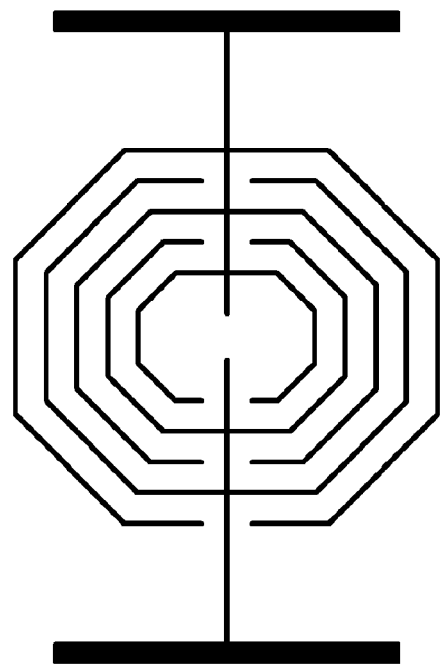
FIGS. 7A through 7C are diagrams of symmetric IDEs according to other exemplary embodiments of the present invention.
Figure 7B:
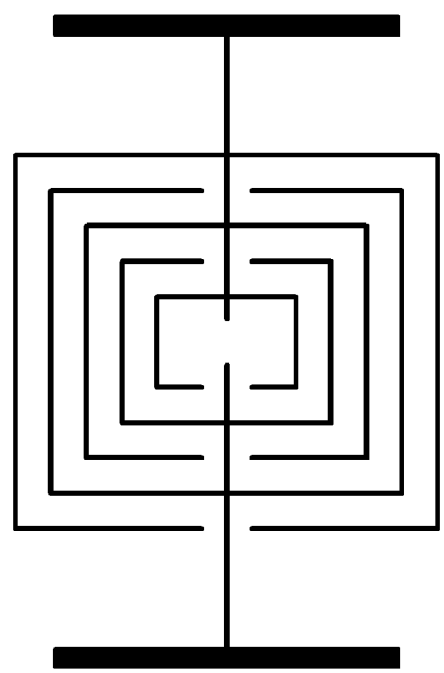
Figure 7C:
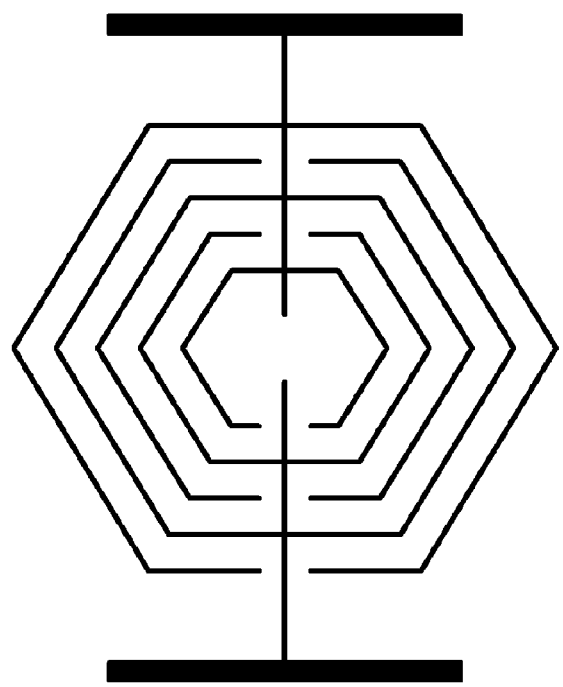

FIGS. 7A through 7C are diagrams of symmetric IDEs according to other exemplary embodiments of the present invention.

Referring to FIGS. 7A through 7C, it can be seen that a symmetric IDE according to the present invention is not limited to a circular shape and can have centrally symmetric, polygonal shapes, such as octagonal, rectangular, and hexagonal shapes.

As explained thus far, the foregoing circular and polygonal IDEs can be more efficiently applied to structures that oscillate or run on central axes. Therefore, the circular and polygonal IDEs can be easily used for any electronic devices, such as sensors, actuators, and MEMS devices. In particular, the present invention demonstrates the effects of a symmetric IDE by focusing on the example of a piezoelectric sensor. In addition, it is clear that the symmetric IDE according to the present invention can be applied to systems that are driven or measure values on central axes, for example, biological sensors, acoustic sensors, and comb actuators.

Figure 8:
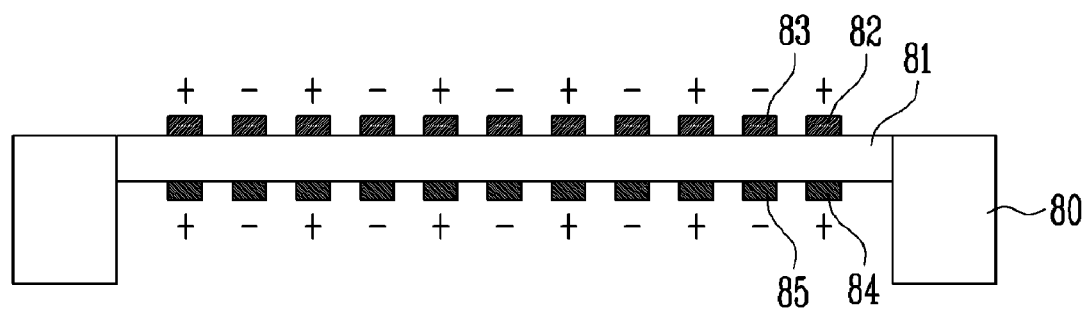
FIG. 8 is a cross-sectional view of an integral electronic device including both a sensor and an actuator using an IDE according to an exemplary embodiment of the present invention.

FIG. 8 is a cross-sectional view of an integral electronic device including both a sensor and an actuator using an IDE according to an exemplary embodiment of the present invention.

Referring to FIG. 8, anodes 82 and cathodes 83 make pairs on a piezoelectric material layer 81 disposed on a substrate 80, while anodes 84 and cathodes 85 make pairs on the piezoelectric material layer 81 disposed on the substrate 80. That is, IDEs are located on and under the piezoelectric material layer 81, thereby enabling the fabrication of a highly integrated electronic device in which an actuator and a sensor are integrally formed. In this case, an IDE located on one surface of the piezoelectric material layer 81 may serve as the actuator, while an IDE located on the other surface thereof may serve as the sensor.

According to the present invention as described above, an IDE in which anodes and cathodes are arranged radially in alternating fashion is fabricated and applied to an electronic device, so that the entire fabrication process can be simplified compared with that of a conventional electronic device in which an upper electrode is different from a lower electrode. Also, circular or polygonal IDEs according to the present invention can be applied to systems that are driven or measure values on their central axes, thereby enhancing the performance and efficiency of the systems.

The circular or polygonal IDEs according to the present invention can be employed in systems such as acoustic sensors, pressure sensors, micro-speakers, biological sensors, and acceleration sensors, so that the structure and operation of the systems can be simplified. Furthermore, the IDEs can be disposed on and under a piezoelectric material layer of an electronic device. Thus, an IDE installed on one surface of the piezoelectric material layer can be used as a sensor, and an IDE installed on the other surface thereof can be used as an actuator, so that the integration density of the electronic device can be improved.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An electronic device, comprising:
   an interdigitated electrode (IDE) including a plurality of anodes and a plurality of cathodes arranged radially in an alternating fashion for electrical insulation from one another;
   a piezoelectric material layer;
   a sensor device including a pressure sensor, an acoustic sensor, and an ultrasonic sensor;
   a micro-electro-mechanical system (MEMS) device including a MEMS actuator and a MEMS sensor;
   a power source device generating the power; and
   a driver device.

2. The device according to claim 1, wherein the anodes and the cathodes are symmetrically interdigitated in a circular or polygonal shape.

3. The device according to claim 1, wherein the IDE further includes ground electrodes electrically insulated from the anodes and the cathodes, and disposed in alternating fashion with one of the anodes and the cathodes.

4. The device according to claim 1, wherein the piezoelectric material layer is formed of one of PMN-PT, PZT, and ZnO.

* * * * *